United States Patent
Chen et al.

(10) Patent No.: US 9,035,228 B2
(45) Date of Patent: May 19, 2015

(54) LIGHT SENSOR AND DRIVING METHOD OF PHOTO TRANSISTOR THEREOF

(71) Applicant: E Ink Holdings Inc., Hsinchu (TW)

(72) Inventors: Wei-Tsung Chen, Hsinchu (TW);
Ted-Hong Shinn, Hsinchu (TW);
Chuang-Chuang Tsai, Hsinchu (TW);
Wen-Chung Tang, Hsinchu (TW);
Chih-Hsiang Yang, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 286 days.

(21) Appl. No.: 13/659,929

(22) Filed: Oct. 25, 2012

(65) Prior Publication Data

US 2014/0048679 A1    Feb. 20, 2014

(30) Foreign Application Priority Data

Aug. 16, 2012   (TW) .............................. 101129792 A

(51) Int. Cl.
*H01J 40/14*   (2006.01)
*H04N 5/335*   (2011.01)
*H04N 5/361*   (2011.01)
*H04N 5/376*   (2011.01)
*H01L 27/144*  (2006.01)

(52) U.S. Cl.
CPC .............. *H04N 5/335* (2013.01); *H04N 5/361* (2013.01); *H04N 5/3765* (2013.01); *H01L 27/1443* (2013.01)

(58) Field of Classification Search
CPC ................................. H01L 27/00; H01J 40/14
USPC ........ 250/214 R, 214 AG, 214 C, 206, 208.1; 315/158
See application file for complete search history.

(56) References Cited

U.S. PATENT DOCUMENTS

| | | | |
|---|---|---|---|
| 2009/0261738 A1* | 10/2009 | Hsu ............................. | 315/158 |
| 2011/0108704 A1* | 5/2011  | Kim et al. ................. | 250/208.1 |
| 2011/0233387 A1  | 9/2011  | Kim et al. | |
| 2014/0252343 A1* | 9/2014  | Chiang et al. ................. | 257/43 |

FOREIGN PATENT DOCUMENTS

| | | |
|---|---|---|
| JP | 2004-320345 | 11/2004 |
| TW |   200834906 | 8/2008 |

(Continued)

OTHER PUBLICATIONS

"Office Action of Taiwan Counterpart Application", issued on Jul. 3, 2014, p. 1-p. 7.

(Continued)

*Primary Examiner* — Kevin Pyo
(74) *Attorney, Agent, or Firm* — Jianq Chyun IP Office

(57) ABSTRACT

A light sensor including a photo transistor is provided. A gate of the photo transistor receives a gate driving signal. The photo transistor senses a light source based on the gate driving signal to generate a light current signal. The photo transistor includes a metal-oxide active layer. The gate driving signal has a first voltage level during a trap period and has a second voltage level during a read period. The first voltage level is higher than the second voltage level. The gate driving signal of the photo transistor introduces a mechanism to rapidly eliminate excess carriers. Accordingly, the photo transistor has a rapid response while maintaining good light responsibility. Furthermore, a method for driving the foregoing photo transistor is also provided.

20 Claims, 5 Drawing Sheets

(56) References Cited

FOREIGN PATENT DOCUMENTS

| | | |
|---|---|---|
| TW | 201112622 | 4/2011 |
| TW | 201119073 | 6/2011 |

OTHER PUBLICATIONS

"Office Action of Taiwan Counterpart Application", issued on Nov. 14, 2014, p. 1-p. 5.

* cited by examiner

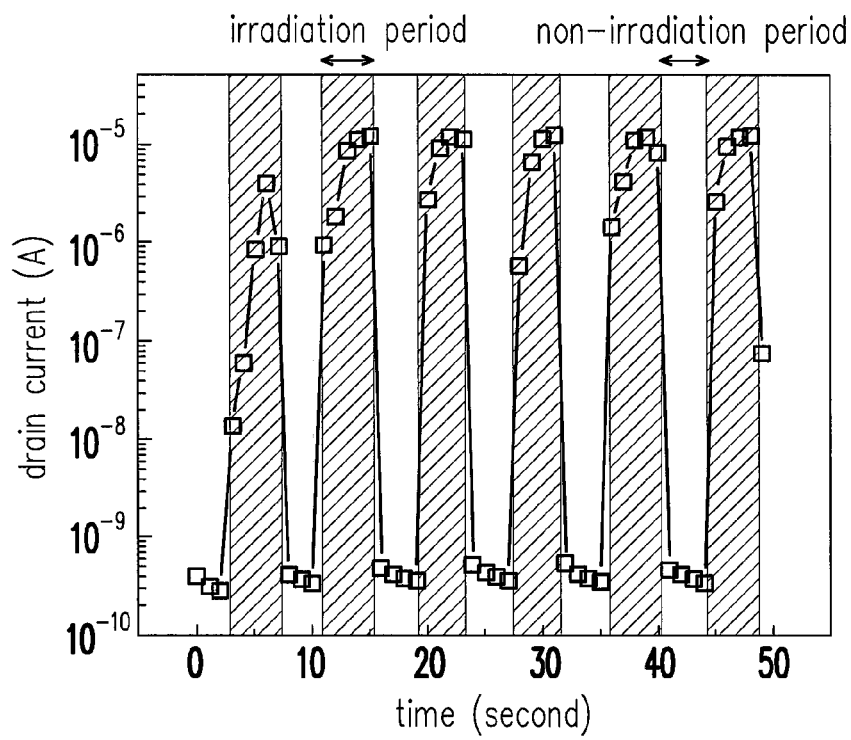

FIG. 4

```
during the read period T2, respectively applying the
gate driving signal VG having the second voltage level
V2, the drain driving signal VD having the fourth
voltage level V4, and the source driving signal VS
having the fifth voltage level V5 to the gate 110, the
drain 130 and the source 120 of the light transistor
100
```
— S500

```
during the trap period T1, respectively applying the
gate driving signal VG having the first voltage level
V1, the drain driving signal VD having the fifth
voltage level V5, and the source driving signal VS
having the fifth voltage level V5 to the gate 110,
the drain 130 and the source 120 of the light
transistor 100
```
— S510

FIG. 5

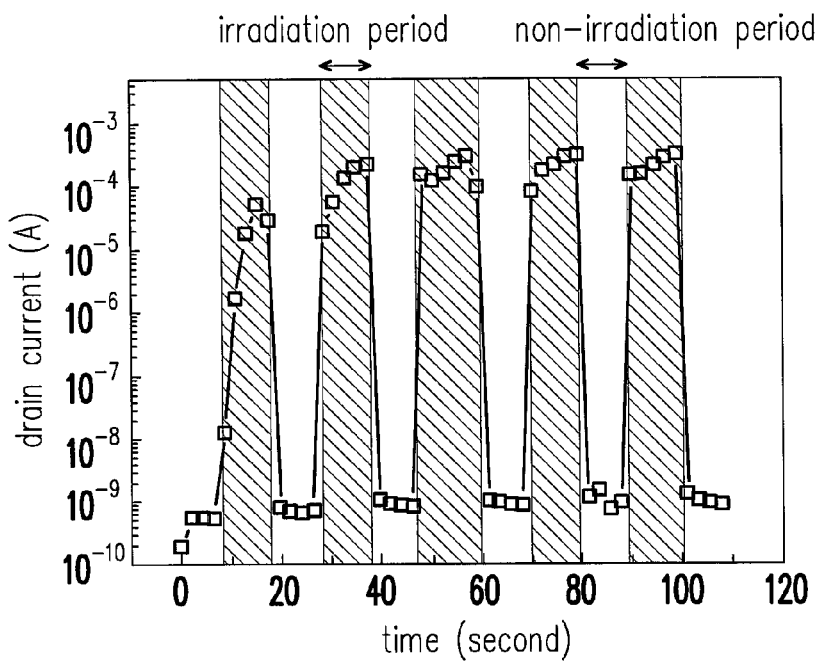

FIG. 7

| during the sense period T3, respectively applying the gate driving signal VG having the third voltage level V3, the drain driving signal VD having the fifth voltage level V5, and the source driving signal VS having the fifth voltage level V5 to the gate 110, the drain 130 and the source 120 of the light transistor 100 | S800 |

| during the read period T2, respectively applying the gate driving signal VG having the second voltage level V2, the drain driving signal VD having the fourth voltage level V4, and the source driving signal VS having the fifth voltage level V5 to the gate 110, the drain 130 and the source 120 of the light transistor 100 | S810 |

| during the trap period T1, respectively applying the gate driving signal VG having the first voltage level V1, the drain driving signal VD having the fifth voltage level V5, and the source driving signal VS having the fifth voltage level V5 to the gate 110, the drain 130 and the source 120 of the light transistor 100 | S820 |

FIG. 8

LIGHT SENSOR AND DRIVING METHOD OF PHOTO TRANSISTOR THEREOF

CROSS-REFERENCE TO RELATED APPLICATION

This application claims the priority benefit of Taiwan application serial no. 101129792, filed on Aug. 16, 2012. The entirety of the above-mentioned patent application is hereby incorporated by reference herein and made a part of this specification.

BACKGROUND OF THE INVENTION

1. Field of the Invention

The invention relates to a sensor and a driving method of a component of the sensor, and more particularly, to a light sensor and a driving method of a photo transistor of the light sensor.

2. Description of Related Art

A common and widespread way of implementing a light sensor is by using a photodiode or a photo transistor. Whereas the photodiode features a rapid response, it cannot provide a good signal ratio. By contrast, though the photo transistor responds slowly, it has impressive responsibility. Specifically speaking, the photo transistor generates a large number of carriers, i.e. electrons or electron holes, in a channel after irradiation. However, excess carriers generated in an active layer of a common photo transistor as a result of irradiation do not disappear immediately after irradiation, but remain for quite a while. Consequently, the next sensing cannot be performed within a short time. Even though the photo transistor has good light responsibility, which is impractical. Therefore, due to lack of a mechanism to rapidly eliminate photoexcited carriers, common photo transistors have a slow response while having impressive light responsibility. Thus, if a mechanism to rapidly eliminate the excess carriers can be introduced to operation of the photo transistor, residual photoexcited carriers can be rapidly removed after irradiation, so as to achieve real-time sensing.

SUMMARY OF THE INVENTION

The invention provides a light sensor. The light sensor includes a photo transistor having a rapid response while maintaining good light responsibility, so as to achieve real-time sensing.

The invention provides a driving method of a photo transistor. The driving method enables a photo transistor of a light sensor to have a rapid response while maintaining good light responsibility, so as to achieve real-time sensing.

The invention provides a light sensor including a photo transistor. A gate of the photo transistor is configured to receive a gate driving signal. The photo transistor senses a light source based on the gate driving signal so as to generate a light current signal. The gate driving signal has a first voltage level during a trap period and has a second voltage level during a read period. Furthermore, the photo transistor includes a metal-oxide active layer.

In an embodiment of the invention, the gate driving signal has a third voltage level during a sense period.

In an embodiment of the invention, a drain of the photo transistor is configured to receive a drain driving signal during the read period. The drain driving signal has a fourth voltage level during the read period.

In an embodiment of the invention, the drain of the photo transistor is configured to receive the drain driving signal during a non-read period. The drain driving signal has a fifth voltage level during the non-read period. The fifth voltage level is lower than the fourth voltage level.

In an embodiment of the invention, a source of the photo transistor is configured to receive a source driving signal. The source driving signal has the fifth voltage level.

The invention provides a driving method of a photo transistor, the driving method including the following steps. A gate driving signal is applied to a gate of the photo transistor during a trap period, wherein the gate driving signal has a first voltage level. The gate driving signal is applied to the gate of the photo transistor during a read period, wherein the gate driving signal has a second voltage level. The photo transistor senses a light source based on the gate driving signal so as to generate a light current signal. Furthermore, the photo transistor includes a metal-oxide active layer.

In an embodiment of the invention, the first voltage level is higher than the second voltage level.

In an embodiment of the invention, the read period and the trap period are staggered in timing.

In an embodiment of the invention, the driving method of the photo transistor further includes applying the gate driving signal to the gate of the photo transistor during a sense period, wherein the gate driving signal has a third voltage level.

In an embodiment of the invention, the second voltage level is higher than the third voltage level.

In an embodiment of the invention, a cycle of the gate driving signal includes the sense period, the read period and the trap period, and the three periods are sequentially arranged in the cycle.

In an embodiment of the invention, the driving method of the photo transistor further includes applying a drain driving signal to a drain of the photo transistor during the read period. The drain driving signal has a fourth voltage level.

In an embodiment of the invention, the driving method of the photo transistor further includes applying the drain driving signal to the drain of the photo transistor during a non-read period. The drain driving signal has a fifth voltage level. The fifth voltage level is lower than the fourth voltage level.

In an embodiment of the invention, the driving method of the photo transistor further includes applying a source driving signal to a source of the photo transistor. The source driving signal has the fifth voltage level.

In an embodiment of the invention, a frequency of the gate driving signal is higher than an irradiation frequency of the light source.

Based on the above, in the exemplary embodiments of the invention, the gate driving signal of the photo transistor introduces a mechanism to rapidly eliminate excess carriers. Accordingly, the photo transistor has a rapid response while maintaining good light responsibility.

To make the aforementioned features and advantages of the invention more comprehensible, embodiments accompanied with figures are described in detail below.

BRIEF DESCRIPTION OF THE DRAWINGS

FIG. 4 illustrates actual operating electrical characteristics of a photo transistor having an active layer made of indium gallium zinc oxide.

FIG. 5 illustrates a flowchart of a driving method of a photo transistor according to an embodiment of the invention.

FIG. 7 illustrates actual operating electrical characteristics of a photo transistor having an active layer made of indium gallium zinc oxide.

FIG. 8 illustrates a flowchart of a driving method of a photo transistor according to another embodiment of the invention.

DESCRIPTION OF EMBODIMENTS

One of the important concepts of the disclosure concerns how to eliminate excess carriers of a photo transistor. The disclosure proposes to trap the excess carriers generated in an active layer as a result of irradiation by using defects of the photo transistor.

Figure 1:
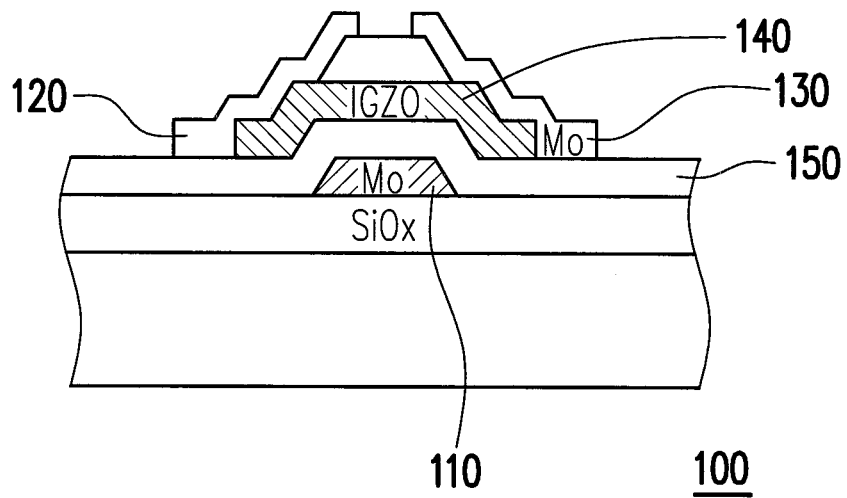
FIG. 1 illustrates a schematic view of a photo transistor according to an embodiment of the invention.

FIG. 1 illustrates a schematic view of a photo transistor according to an embodiment of the invention. Referring to FIG. 1, a photo transistor 100 of this embodiment includes at least structures such as a gate 110, a source 120, a drain 130, an active layer 140 and a dielectric layer 150, as shown in FIG. 1. In this embodiment, the active layer 140 is made of including a metal-oxide semiconductor such as indium gallium zinc oxide (IGZO) or hafnium indium zinc oxide (HIZO). However, the invention is not limited thereto. The materials labeled in FIG. 1 and their thicknesses are for the purpose of illustration only.

Figure 2:
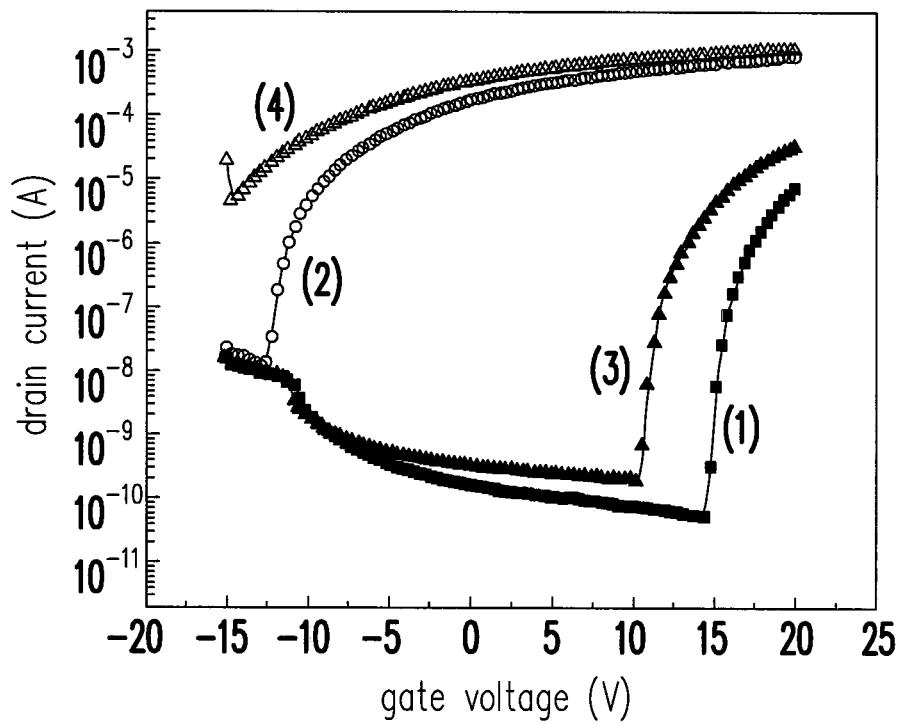
FIG. 2 illustrates a schematic view of electrical characteristics of the photo transistor in the embodiment of FIG. 1.

FIG. 2 illustrates a schematic view of electrical characteristics of the photo transistor in the embodiment of FIG. 1. Referring to FIG. 1 and FIG. 2, what FIG. 2 illustrates are, for example, electrical characteristics of an n-channel metal-oxide transistor, which shows characteristics of a memory. In this embodiment, after irradiation, electrical curves of the photo transistor 100 move leftward, as shown by curves (2) and (4) in FIG. 2. When a positive voltage is applied to the gate 110 of the photo transistor 100, the electrical curves move rightward, as shown by curves (1) and (3) in FIG. 2. The rightward-moving curves indicate that excess carriers generated in the active layer 140 as a result of the irradiation are trapped. The mechanism to trap electrons is the defects of the active layer 140 or the defects in an interface between the active layer 140 and the dielectric layer 150. By rapidly eliminating the excess carriers using the defects, the photo transistor is provided with a real-time sensing mechanism. As for metal-oxide semiconductor, it has a considerable number of defects.

It should be noted that the driving method disclosed herein is widely applicable to any common photo transistor structure. No special mechanism design is required. Moreover, the driving method is neither limited to the photo transistor disclosed by FIG. 1 nor to the photo transistor having the electrical characteristics as in FIG. 2. To better understand the invention, at least one exemplary embodiment accompanied by drawings is described in the following to illustrate the operation of the photo transistor in detail.

Figure 3:
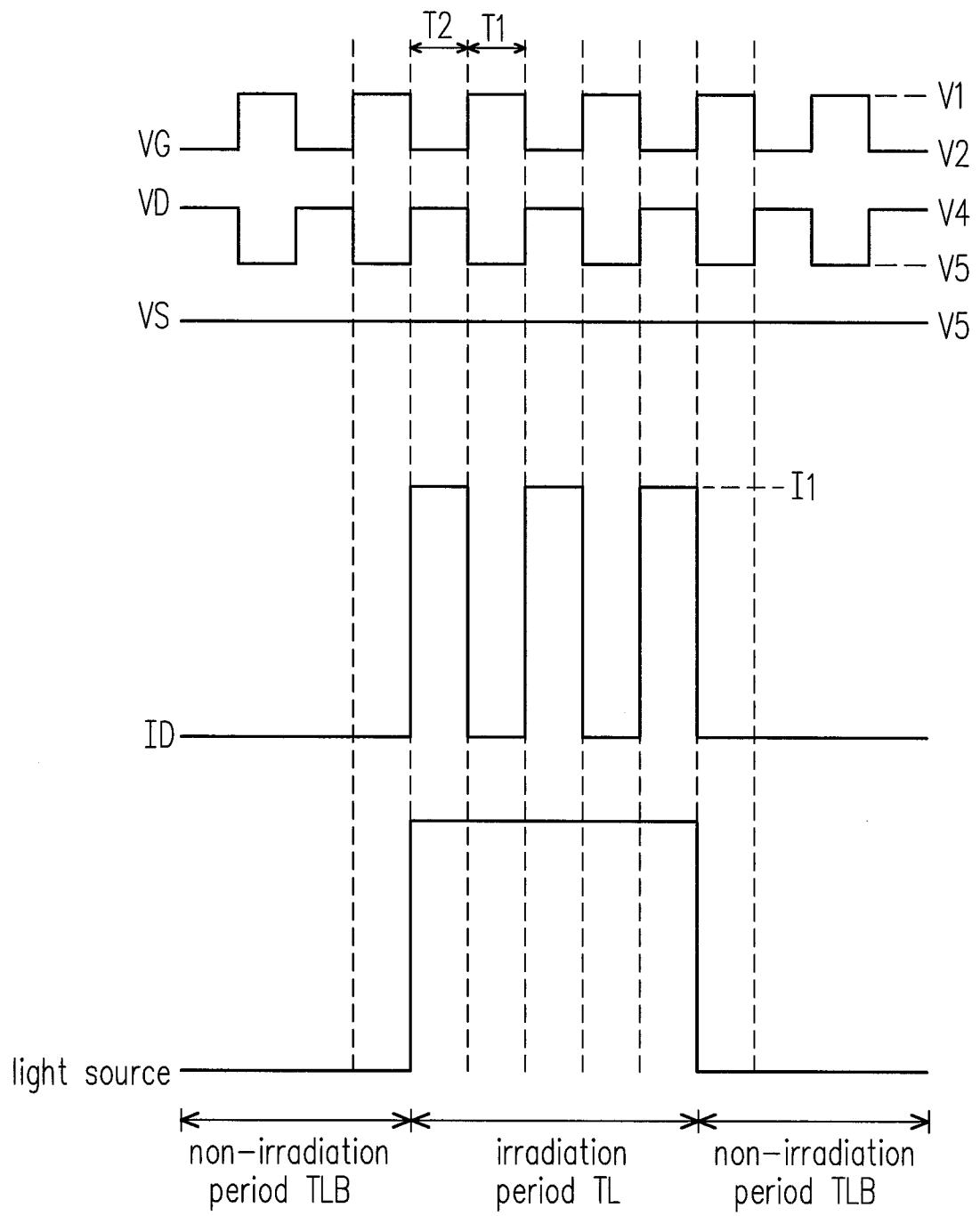
FIG. 3 illustrates schematic waveforms of respective driving signals of a photo transistor according to an embodiment of the invention.

FIG. 3 illustrates schematic waveforms of respective driving signals of a photo transistor according to an embodiment of the invention. Referring to FIG. 1 and FIG. 3, a voltage signal VG of this embodiment is a driving signal applied to the gate 110 of the photo transistor 100. The voltage signal VG has a first voltage level V1 during a trap period T1 and has a second voltage level V2 during a read period T2. Moreover, the first voltage level V1 is higher than the second voltage level V2. In this embodiment, the first voltage level V1 is, for example, 10V, and the second voltage level V2 is, for example, 0V. However, the invention is not limited thereto. In actual practice, at least to work in conjunction with the driving signal VG, the operating manners of the drain 130 and the source 120 of the photo transistor 100 are also configured in this embodiment. In this embodiment, the drain 130 of the photo transistor 100 is configured to receive a drain driving signal VD. During the read period T2, the drain driving signal VD has a fourth voltage level V4. The fourth voltage level V4 may be substantially the same as or different from the first voltage level V1 depending on actual design needs. During a non-read period, the drain driving signal VD has a fifth voltage level V5. The fifth voltage level V5 may be substantially the same as or different from the second voltage level V2 depending on actual design needs. The non-read period herein includes the trap period T1. In addition, in this embodiment, the source 120 of the photo transistor 100 is configured to receive a source driving signal VS. Whether during the trap period T1 or during the read period T2, the level of the source driving signal VS is substantially equal to the fifth voltage level V5.

In FIG. 3, the light source having a higher level during an irradiation period TL indicates that the photo transistor 100 is being irradiated. In this embodiment, the defects of the active layer 140 or the defects in the interface between the active layer and the dielectric layer 150 do not trap the excess carriers during the irradiation period TL. That is, the defects do not hinder the generation of the excess carriers during the irradiation period TL, but start to take effect only during a non-irradiation period TLB. The excess carriers generated as a result of the irradiation are rapidly trapped by the defects and lose mobility after the light source is removed. When the irradiation resumes, the trapped excess carriers will be released. That is, the defects are inactive during the irradiation period TL.

Therefore, when a series of successive light states and dark states occur, the excess carriers in the photo transistor 100 will be successively activated and frozen, so as to show real-time activation. In this embodiment, the defects of the photo transistor 100 trap the excess carriers in a situation where the first voltage level V1 is applied to a gate of the photo transistor 100. At the time a positive bias voltage is applied to the gate, a channel of the photo transistor 100 is injected with a large number of electrons. It is improper to read a signal at such moment, since the excess carriers and the electrons introduced by the positive gate bias voltage are mixed together in the channel. Accordingly, only the signal trapped during the time other than the period in which the positive gate bias voltage is applied, i.e., during the read period T2, is correct. Therefore, in this embodiment, a cyclic variation shows in the voltage level of the gate driving signal VG, and the read period T2 and the trap period T1 are set to be staggered in timing. It should be noted that the duty cycles of the read period and the trap period are not intended to limit the invention. Herein the duty cycles are represented as 1:1 for exemplary purposes. During the trap period T1, a gate bias is a relatively large positive voltage; during the read period T2, the gate bias is set to approximately 0V. A frequency of the gate driving signal VG basically determines speed of light sensing. However, a real-time response can be achieved only when the cycle of the gate driving signal VG is shorter than the irradiation period TL. As shown in FIG. 3, during the irradiation period TL, the photo transistor 100 senses the light source based on the gate driving signal VG so as to generate a light current signal ID. The light current signal here is, for example, a drain current ID of the photo transistor 100. While the photo transistor 100 is being irradiated by light, during the irradiation period TL the drain current ID is in an oscillation mode, in which the drain current ID has the same change cycle as the gate driving signal VG. At this moment, a light strength signal is an amplitude of the drain current ID, and a value thereof is, for example, I1.

FIG. 4 illustrates actual operating electrical characteristics of a photo transistor having an active layer made of indium gallium zinc oxide. By driving such type of photo transistor using the signal in FIG. 3, not only the drain current of the photo transistor has a real-time response to light, but a signal ratio between the light and dark states reaches as high as 10000 times.

In brief, FIG. 5 illustrates a flowchart of a driving method of a photo transistor according to an embodiment of the invention. Referring to FIG. 5, the light sensor of this embodiment includes, for example, the photo transistor in FIG. 1. The driving method includes the following steps. First, in step S500, during the read period T2, the gate driving signal VG having the second voltage level V2, the drain driving signal VD having the fourth voltage level V4, and the source driving signal VS having the fifth voltage level V5 are applied respectively to the gate 110, the drain 130 and the source 120 of the photo transistor 100. Next, in step S510, during the trap period T1, the gate driving signal VG having the first voltage level V1, the drain driving signal VD having the fifth voltage level V5, and the source driving signal VS having the fifth voltage level V5 are applied respectively to the gate 110, the drain 130 and the source 120 of the photo transistor 100. Accordingly, the photo transistor 100 senses the light source based on the driving signals to generate the light current signal ID. It should be noted that the step S510 may be executed prior to the step S500. The order of the two steps is not intended to limit the invention.

In addition, regarding the driving method of the photo transistor of the embodiment of the invention, sufficient teaching, suggestion, and implementation illustration can be obtained from the descriptions of the embodiments shown in FIGS. 1 to 4, and therefore the driving method is not described repeatedly.

Figure 6:
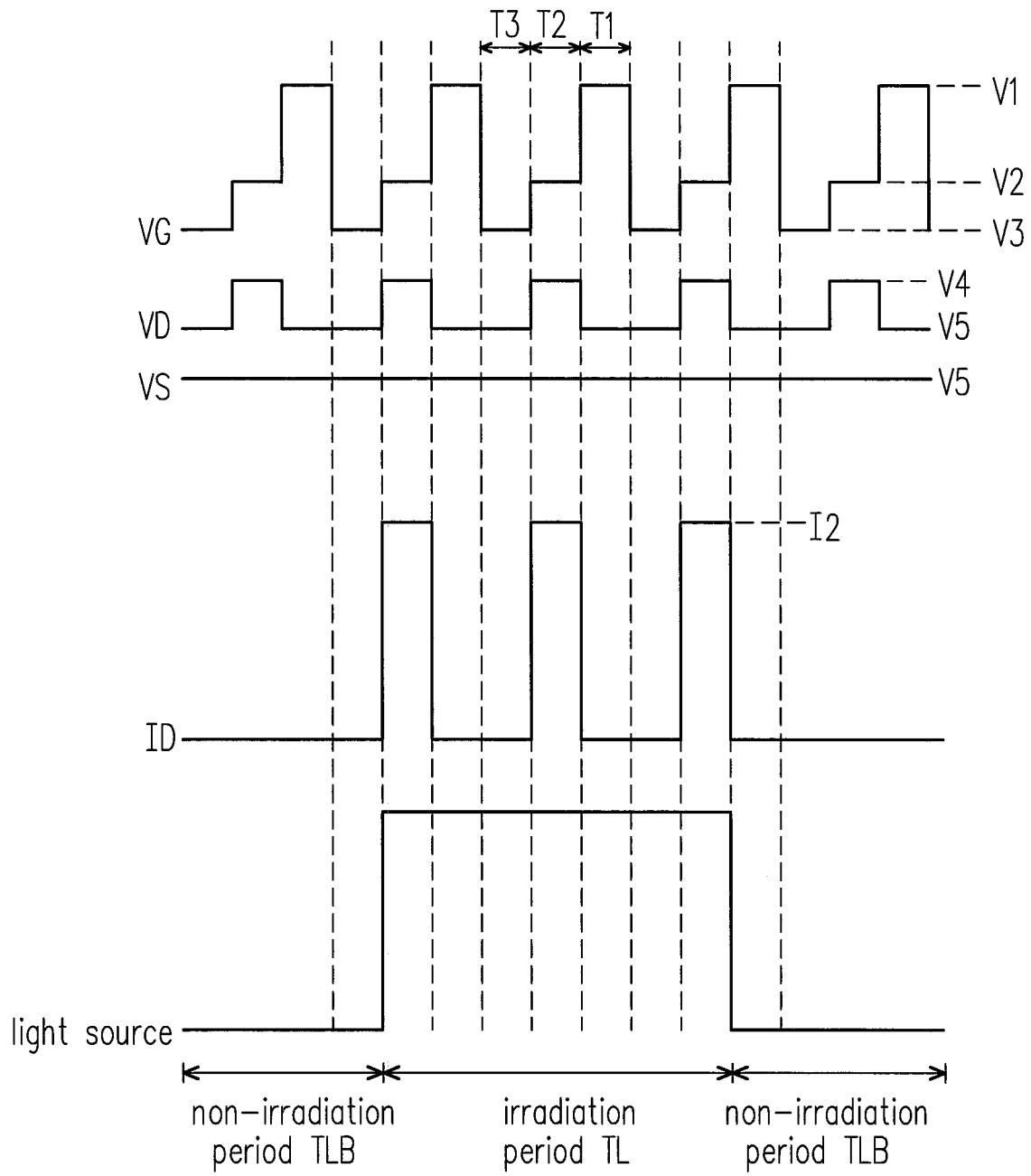
FIG. 6 illustrates schematic waveforms of respective driving signals of a photo transistor according to another embodiment of the invention.

FIG. 6 illustrates schematic waveforms of respective driving signals of a photo transistor according to another embodiment of the invention. Referring to FIG. 1 and FIG. 6, the respective driving signals of this embodiment are similar to those in FIG. 3. Nevertheless, the two embodiments are different mainly in that, for example, the gate driving signal VG in FIG. 6 further includes a sense period T3, and the gate driving signal VG has a third voltage level V3 during this period. The third voltage level V3 is, for example, a negative voltage value. The details thereof are as follows.

In this embodiment, a cycle of the gate driving signal VG includes the sense period T3, the read period T2 and the trap period T1, and the three periods are sequentially arranged in each cycle. However, the arrangement and duty cycles of the three periods are not intended to limit the invention. The gate driving signal VG of this embodiment has the first voltage level V1, the second voltage level V2 and the third voltage level V3 during respectively the sense period T3, the read period T2 and the trap period T1. One of the embodiments for the voltage level values is, for example, V1=30V, V2=0V and V3=−10V. However, the invention is not limited thereto.

Similar to the embodiment of FIG. 3, the operating manners of the drain 130 and the source 120 of the photo transistor 100 are also configured in this embodiment. In this embodiment, during the read period T2, the level of the drain driving signal VD is substantially equal to the fourth voltage level V4; during the non-read period, the level of the drain driving signal VD is substantially equal to the fifth voltage level V5. The non-read period herein includes the sense period T3 and the trap period T1. In addition, in this embodiment, whether during the trap period T1 or during the read period T2, the level of the source driving signal VS is substantially equal to the fifth voltage level V5.

As for metal-oxide semiconductor, an application of a negative gate bias voltage accompanied by irradiation results in that an electron hole is trapped in the interface between the active layer 140 and the dielectric layer 150. As a result of the electron hole being trapped, more electrons are attracted under the same gate voltage. That is, the application of the negative gate bias voltage results in more excess carriers, and these excess carriers may also be trapped by the defects in the dark state. Therefore, in this embodiment, the sense period T3 is arranged between the read period T2 and the trap period T1 in FIG. 3, such that a cycle of the gate driving signal VG includes the sense period T3, the read period T2 and the trap period T1. During the sense period T3, the gate bias is a relatively large negative voltage; during the read period T2, the gate bias is set to approximately 0V; during the trap period T1, the gate bias is a relatively large positive voltage.

In this embodiment, the photo transistor 100 senses the light source based on the gate driving signal VG so as to generate the light current signal ID. The light current signal here is, for example, the drain current ID of the photo transistor 100. While the photo transistor 100 is being irradiated by light, during the irradiation period TL the drain current ID is in an oscillation mode, in which the drain current ID has the same change cycle as the gate driving signal VG. At this moment, the light strength signal is the amplitude of the drain current ID, and the value thereof is, for example, I2. Compared to the embodiment of FIG. 3, since the gate driving signal VG of this embodiment further includes the sense period T3, the amplitude I2 of the drain current ID is greater than I1.

FIG. 7 illustrates actual operating electrical characteristics of a photo transistor having an active layer made of indium gallium zinc oxide. By driving such type of photo transistor by the signal in FIG. 6, not only the drain current of the photo transistor has a real-time response to light, but a signal ratio between the light and dark states reaches as high as 100,000 times.

In brief, FIG. 8 illustrates a flowchart of a driving method of a photo transistor according to another embodiment of the invention. Referring to FIG. 8, the light sensor of this embodiment includes, for example, the photo transistor in FIG. 1. The driving method includes the following steps. First, in step S800, during the sense period T3, the gate driving signal VG having the third voltage level V3, the drain driving signal VD having the fifth voltage level V5, and the source driving signal VS having the fifth voltage level V5 are applied respectively to the gate 110, the drain 130 and the source 120 of the photo transistor 100. Next, in step S810, during the read period T2, the gate driving signal VG having the second voltage level V2, the drain driving signal VD having the fourth voltage level V4, and the source driving signal VS having the fifth voltage level V5 are applied respectively to the gate 110, the drain 130 and the source 120 of the photo transistor 100. Then, in step S820, during the trap period T1, the gate driving signal VG having the first voltage level V1, the drain driving signal VD having the fifth voltage level V5, and the source driving signal VS having the fifth voltage level V5 are applied respectively to the gate 110, the drain 130 and the source 120 of the photo transistor 100. Accordingly, the photo transistor 100 senses the light source based on the driving signals to generate the light current signal ID. It should be noted that the execution order of the steps S800, S810 and S820 in this driving method are not intended to limit the invention.

In addition, regarding the driving method of the photo transistor of the embodiment of the invention, sufficient teaching, suggestion, and implementation illustration can be obtained from the descriptions of the embodiments shown in FIGS. 1 to 2 and FIGS. 6 to 7, and therefore the driving method is not described repeatedly.

In summary to the above, in the exemplary embodiments of the invention, the structure of the photo transistor may be any common structure. No special mechanism design is required. The method for rapidly eliminating the excess carriers after entering the dark state is to periodically apply a positive bias voltage to the gate of the photo transistor. Basically, application frequency of the bias voltage determines a sensing rate of the photo transistor. In addition, positive charge formed by periodically applying a negative bias voltage to the gate of the photo transistor may also be configured to trap the excess carriers so as to increase the number of the carriers in the light state, thus enhancing the signal ratio between the light and dark states. Thus the driving method of the photo transistor disclosed herein not only maintains the feature of good responsibility of common photo transistors, but also improves the response speed thereof significantly.

Although the invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions.

What is claimed is:

1. A light sensor, comprising:
   a photo transistor comprises a gate to receive a gate driving signal, and the photo transistor sensing a light source based on the gate driving signal so as to generate a light current signal,
   wherein the gate driving signal has a first voltage level during a trap period and has a second voltage level during a read period, and the photo transistor comprises a metal-oxide active layer,
   wherein the metal-oxide active layer is made of including a metal-oxide semiconductor.

2. The light sensor as claimed in claim 1, wherein the first voltage level is higher than the second voltage level.

3. The light sensor as claimed in claim 1, wherein the read period and the trap period are staggered in timing.

4. The light sensor as claimed in claim 1, wherein the gate driving signal has a third voltage level during a sense period.

5. The light sensor as claimed in claim 4, wherein the second voltage level is higher than the third voltage level.

6. The light sensor as claimed in claim 4, wherein a cycle of the gate driving signal comprises the sense period, the read period and the trap period, the three periods being sequentially arranged in the cycle.

7. The light sensor as claimed in claim 1, wherein a drain of the photo transistor is configured to receive a drain driving signal during the read period, the drain driving signal having a fourth voltage level during the read period.

8. The light sensor as claimed in claim 7, wherein the drain of the photo transistor is configured to receive the drain driving signal during a non-read period, the driving signal having a fifth voltage level during the non-read period, the fifth voltage level being lower than the fourth voltage level.

9. The light sensor as claimed in claim 8, wherein a source of the photo transistor is configured to receive a source driving signal having the fifth voltage level.

10. The light sensor as claimed in claim 1, wherein a frequency of the gate driving signal is higher than an irradiation frequency of the light source.

11. A driving method of a photo transistor, comprising:
    applying a gate driving signal to a gate of the photo transistor during a trap period, wherein the gate driving signal has a first voltage level; and
    applying the gate driving signal to the gate of the photo transistor during a read period, wherein the gate driving signal has a second voltage level,
    wherein the photo transistor senses a light source based on the gate driving signal so as to generate a light current signal, and the photo transistor comprises a metal-oxide active layer,
    wherein the metal-oxide active layer is made of including a metal-oxide semiconductor.

12. The driving method of the photo transistor as claimed in claim 11, wherein the first voltage level is higher than the second voltage level.

13. The driving method of the photo transistor as claimed in claim 11, wherein the read period and the trap period are staggered in timing.

14. The driving method of the photo transistor as claimed in claim 11, further comprising:
    applying the gate driving signal to the gate of the photo transistor during a sense period, wherein the gate driving signal has a third voltage level.

15. The driving method of the photo transistor as claimed in claim 14, wherein the second voltage level is higher than the third voltage level.

16. The driving method of the photo transistor as claimed in claim 14, wherein a cycle of the gate driving signal comprises the sense period, the read period and the trap period, the three periods being sequentially arranged in the cycle.

17. The driving method of the photo transistor as claimed in claim 11, further comprising:
    applying a drain driving signal to a drain of the photo transistor during the read period, wherein the drain driving signal has a fourth voltage level.

18. The driving method of the photo transistor as claimed in claim 17, further comprising:
    applying the drain driving signal to the drain of the photo transistor during a non-read period, wherein the drain driving signal has a fifth voltage level, the fifth voltage signal being lower than the fourth voltage signal.

19. The driving method of the photo transistor as claimed in claim 18, further comprising:
    applying a source driving signal to a source of the photo transistor, wherein the source driving signal has the fifth voltage level.

20. The driving method of the photo transistor as claimed in claim 11, wherein a frequency of the gate driving signal is higher than an irradiation frequency of the light source.

* * * * *